US012751072B2

(12) United States Patent
Chen et al.

(10) Patent No.: US 12,751,072 B2
(45) Date of Patent: Sep. 29, 2026

(54) SEMICONDUCTOR DEVICE

(71) Applicant: UNITED MICROELECTRONICS CORP., Hsin-Chu City (TW)

(72) Inventors: Chang-Yih Chen, Tainan City (TW); Kuo-Hsing Lee, Hsinchu County (TW); Chun-Hsien Lin, Tainan City (TW); Chih-Chin Tsai, Tainan City (TW); Chih-Kai Kang, Tainan City (TW); Kun-Szu Tseng, Tainan City (TW); Sheng-Yuan Hsueh, Tainan City (TW); Yao-Jhan Wang, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 337 days.

(21) Appl. No.: 18/629,963

(22) Filed: Apr. 9, 2024

(65) Prior Publication Data

US 2025/0279359 A1 Sep. 4, 2025

(30) Foreign Application Priority Data

Mar. 4, 2024 (TW) ................................ 113107665

(51) Int. Cl.

| | |
|---|---|
| ***H10D 64/27*** | (2025.01) |
| ***H10D 64/01*** | (2025.01) |
| ***H10D 64/66*** | (2025.01) |

(52) U.S. Cl.
CPC ....... *H10D 64/518* (2025.01); *H10D 64/0112* (2026.01); *H10D 64/516* (2025.01); *H10D 64/667* (2025.01)

(58) Field of Classification Search
CPC ........................... H10D 64/518; H10D 64/516
See application file for complete search history.

(56) References Cited

U.S. PATENT DOCUMENTS

| | | | | |
|---|---|---|---|---|
| 5,918,133 A * | 6/1999 | Gardner | H10P 30/204 | 257/E21.258 |
| 6,121,666 A * | 9/2000 | Burr | H10D 30/0221 | 257/E29.054 |
| 6,455,894 B1 * | 9/2002 | Matsumoto | H10D 86/01 | 257/349 |
| 8,507,979 B1 * | 8/2013 | Huang | H10D 30/021 | 257/334 |
| 8,546,252 B2 * | 10/2013 | Anderson | H10D 64/671 | 438/592 |

(Continued)

OTHER PUBLICATIONS

Copending U.S. Appl. No. 19/030,955, filed 2025*
Copending U.S. Appl. No. 18/524,661, filed 2023.*
Copending U.S. Appl. No. 18/631,070, filed 2024.*

*Primary Examiner* — Lauren R Bell
(74) *Attorney, Agent, or Firm* — Winston Hsu

(57) ABSTRACT

A semiconductor device includes a metal gate on a substrate, an interlayer dielectric (ILD) layer around the metal gate, and a recess between the ILD layer and the metal gate. Preferably, the metal gate includes a high-k dielectric layer on the substrate, a work function metal (WFM) layer on the high-k dielectric layer, and a low resistance metal layer on the WFM layer, a top surface of the WFM layer is lower than a top surface of the high-k dielectric layer, a top surface of the WFM layer is lower than a top surface of the low resistance metal layer, and the recess is in the WFM layer.

16 Claims, 6 Drawing Sheets

(56) References Cited

U.S. PATENT DOCUMENTS

| | | | | |
|---|---|---|---|---|
| 8,896,030 | B2 * | 11/2014 | Mukherjee | H10D 84/0179 257/204 |
| 8,946,793 | B2 * | 2/2015 | Xie | H10D 64/01324 257/288 |
| 9,496,361 | B1 * | 11/2016 | Tung | H10D 64/01 |
| 9,853,021 | B1 * | 12/2017 | Wang | H10D 30/603 |
| 10,008,578 | B1 * | 6/2018 | Lee | H10D 64/679 |
| 10,062,604 | B2 * | 8/2018 | Chang | H10W 20/072 |
| 10,505,007 | B1 * | 12/2019 | Su | H10D 64/667 |
| 11,081,357 | B2 * | 8/2021 | Lee | H10D 64/01338 |
| 2022/0005952 | A1 * | 1/2022 | Singh | H10D 30/65 |
| 2022/0367688 | A1 * | 11/2022 | Hsiao | H10D 30/024 |
| 2023/0010065 | A1 * | 1/2023 | Chiu | H10D 62/343 |
| 2023/0154994 | A1 * | 5/2023 | Shimatou | H10D 64/516 257/329 |
| 2024/0021684 | A1 * | 1/2024 | Lin | H10D 30/6729 |
| 2024/0072170 | A1 * | 2/2024 | Yin | H10D 64/518 |
| 2024/0088041 | A1 * | 3/2024 | Pan | H10P 70/27 |
| 2024/0128345 | A1 * | 4/2024 | Xie | H10D 30/6735 |
| 2024/0274691 | A1 * | 8/2024 | Wu | H10D 64/017 |
| 2024/0321726 | A1 * | 9/2024 | Lee | H10D 84/83 |
| 2024/0413086 | A1 * | 12/2024 | Kim | H10D 30/014 |
| 2025/0046718 | A1 * | 2/2025 | Chen | H10W 20/069 |
| 2025/0241001 | A1 * | 7/2025 | Huang | H10D 30/62 |
| 2025/0275217 | A1 * | 8/2025 | Xue | H10D 64/015 |
| 2025/0280562 | A1 * | 9/2025 | Chen | H10D 30/62 |

* cited by examiner

SEMICONDUCTOR DEVICE

BACKGROUND OF THE INVENTION

1. Field of the Invention

The invention relates to a semiconductor device, and more particularly, to a metal gate transistor having recess between interlayer dielectric (ILD) layer and metal gate.

2. Description of the Prior Art

As technology advances, augmented reality (AR) and virtual reality (VR) applications also progresses rapidly and in a foreseen future, AR and VR applications will likely be applicable to our daily lives including various applications in the fields of education, logistics, medicine, and military.

Currently, AR and VR applications are commonly implemented by head-mounted displays. The head-mounted displays in most circumstances connect the display driver integrated circuits (DDICs) including high-voltage (HV) devices, medium-voltage (MV) devices, and/or low-voltage (LV) devices to a display module through extremely long wires or metal interconnections. This design is typically applied to larger scale products that not only consumes a great amount of space but also increases the difficulty for mounting the device. Hence, how to improve the current process for producing a display device suitable for both AR and VR environments has become an important task in this field.

SUMMARY OF THE INVENTION

According to an embodiment of the present invention, a semiconductor device includes a metal gate on a substrate, an interlayer dielectric (ILD) layer around the metal gate, and a recess between the ILD layer and the metal gate. Preferably, the metal gate includes a high-k dielectric layer on the substrate, a work function metal (WFM) layer on the high-k dielectric layer, and a low resistance metal layer on the WFM layer, a top surface of the WFM layer is lower than a top surface of the high-k dielectric layer, a top surface of the WFM layer is lower than a top surface of the low resistance metal layer, and the recess is in the WFM layer.

According to another aspect of the present invention, a semiconductor device includes a first gate structure and a second gate structure extending along a first direction on a substrate, a first contact plug extending along the first direction adjacent to one side of the first gate structure, a second contact plug extending along the first direction adjacent to another side of the second gate structure, and a dummy contact plug extending along the first direction between the first gate structure and the second gate structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
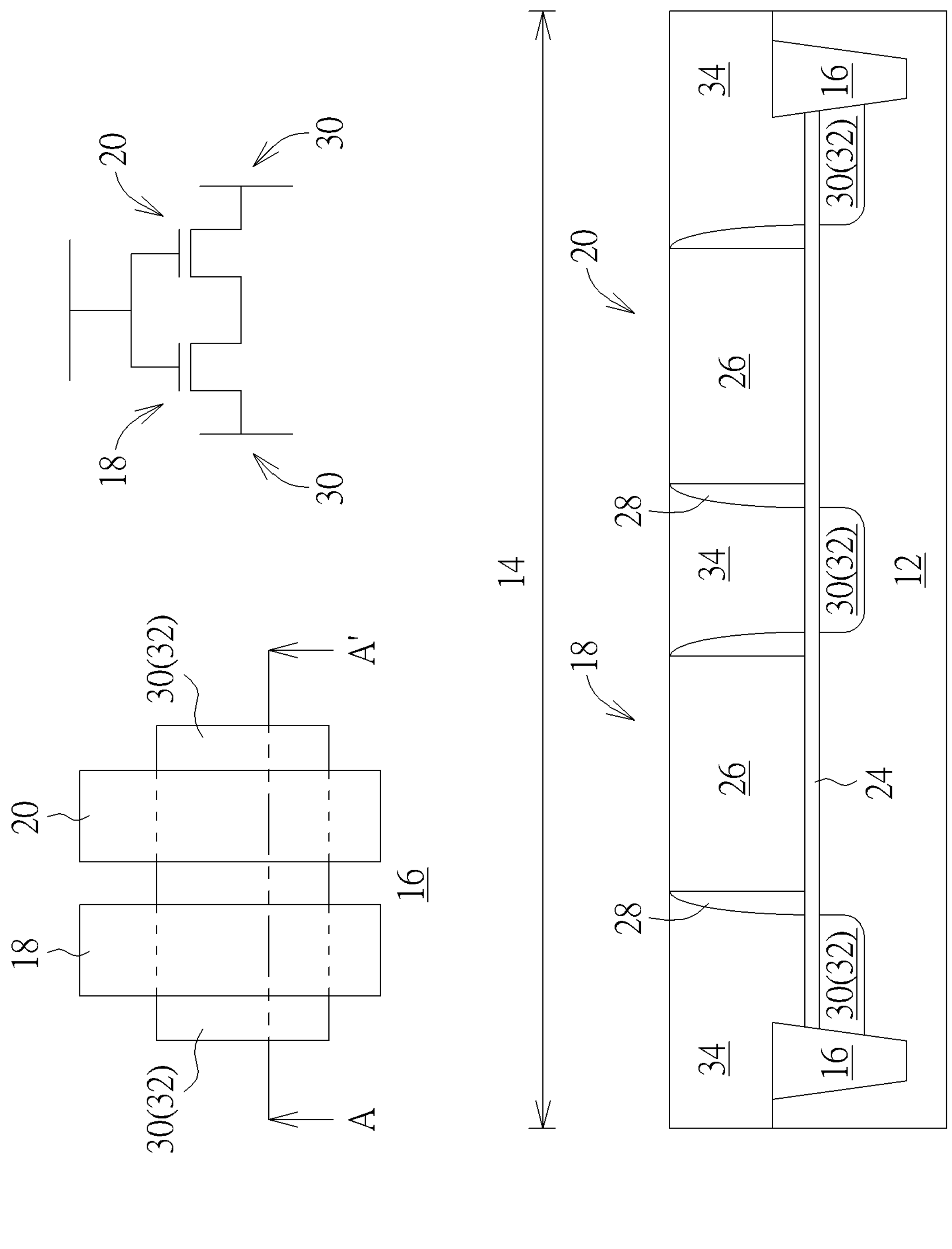
FIGS. 1-3 illustrate a method for fabricating a semiconductor device according to an embodiment of the present invention.

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

Figure 2:
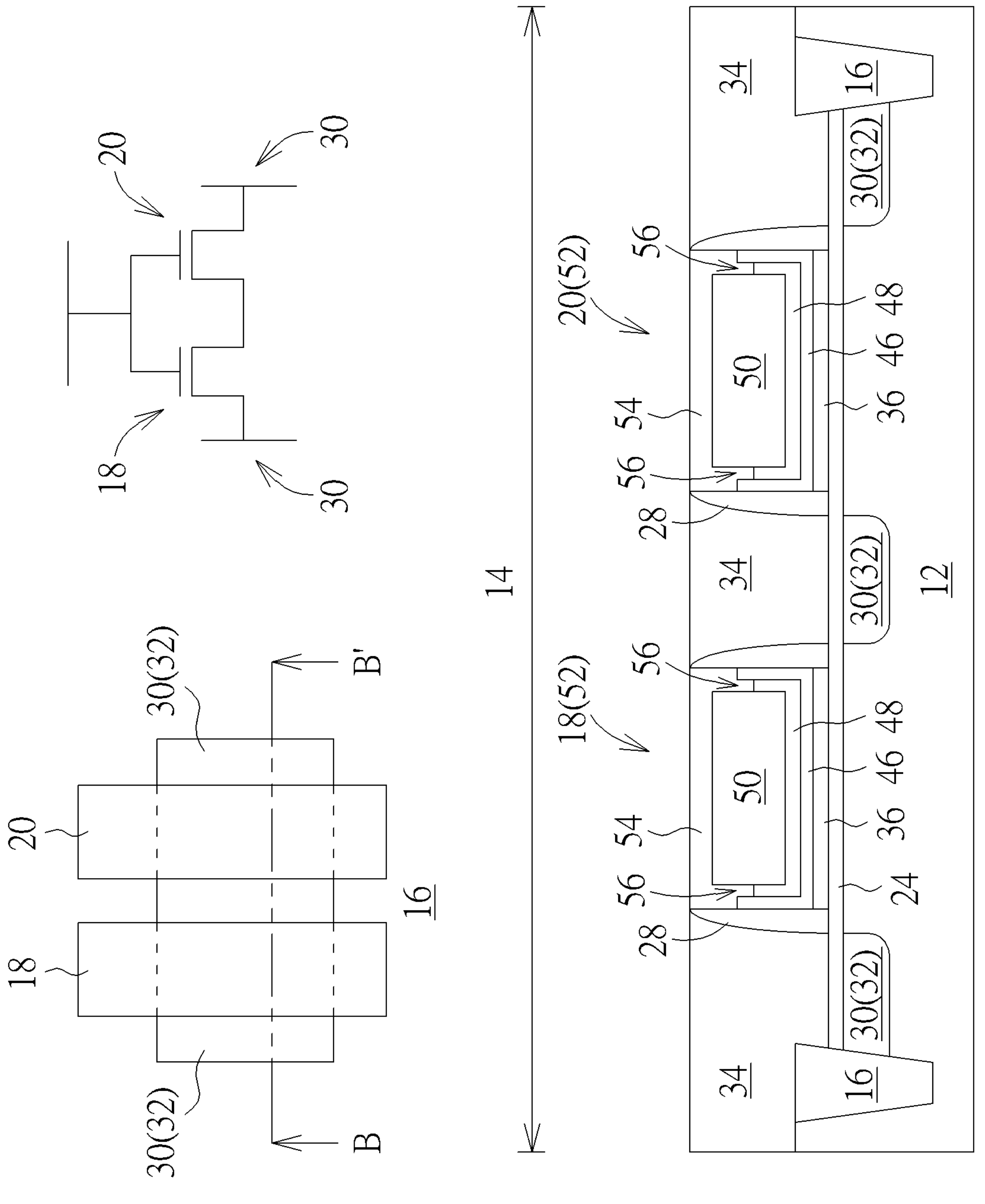
Figure 3:
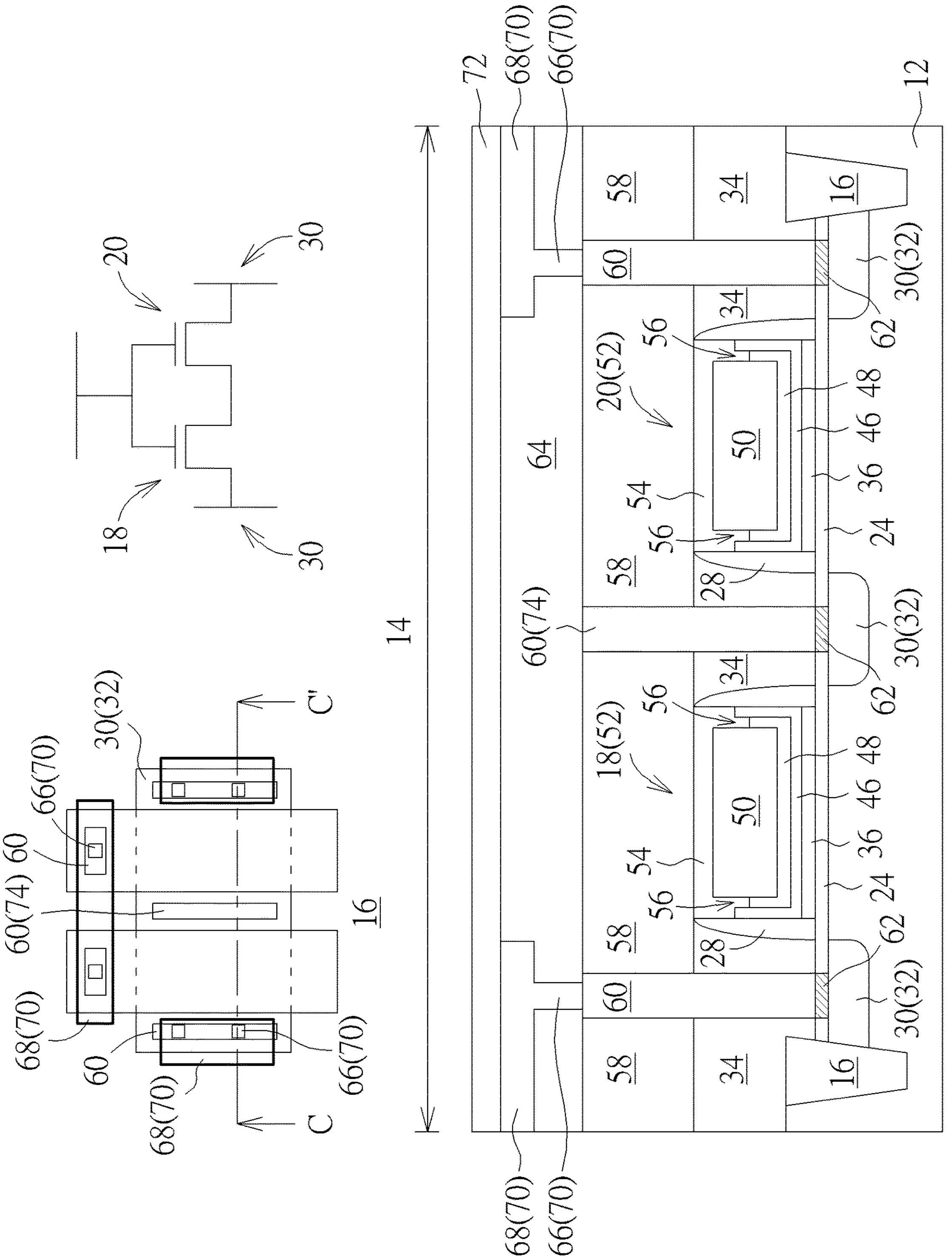

Referring to FIGS. 1-3, FIGS. 1-3 illustrate a method for fabricating a semiconductor device according to an embodiment of the present invention, in which the top left portion of FIG. 1 illustrates a top view for fabricating the semiconductor device according to an embodiment of the present invention, the top right portion of FIG. 1 illustrates a circuit diagram of the semiconductor device, and the lower portion of FIG. 1 illustrates a cross-section view for fabricating the semiconductor device taken along the sectional line AA' of the top left portion of FIG. 1. As shown in FIG. 1, a substrate 12, such as a silicon substrate or silicon-on-insulator (SOI) substrate is first provided and a planar transistor region 14 or active region such as a high-voltage (HV) region or a medium-voltage (MV) region for fabricating HV devices or MV devices is defined on the substrate 12. It should be noted that even though the present embodiment pertains to fabricate planar field effect transistors (FET), according to other embodiment of the present invention, it would also be desirable to apply the follow-up fabrication process to non-planar devices such as fin field effect transistor (FinFET) fabrications, which is also within the scope of the present invention.

According to an embodiment of the present invention, the fin-shaped structures of this embodiment could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structures could also be obtained by first forming a patterned mask (not shown) on the substrate, 12, and through an etching process, the pattern of the patterned mask is transferred to the substrate 12 to form the fin-shaped structures. Moreover, the formation of the fin-shaped structures could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structures. These approaches for forming fin-shaped structure are all within the scope of the present invention.

Next, a shallow trench isolation (STI) 16 is formed around the transistor region 14. In this embodiment, the formation of the STI 16 could be accomplished by conducting a flowable chemical vapor deposition (FCVD) process to form a silicon oxide layer in the substrate 12 and around the transistor region 14. Next, a chemical mechanical polishing (CMP) process along with an optional etching process are conducted to remove part of the silicon oxide layer so that the top surface of the remaining silicon oxide is slightly higher than the top surface of the substrate 12 on the transistor region 14 for forming the STI 16. Alternatively, according to other embodiment of the present invention, the top surface of the STI 16 could also be even with or slightly lower than the top surface of the substrate 12, which is also within the scope of the present invention.

Next, gates structures 18, 20 or dummy gates are formed on the substrate 12. In this embodiment, the formation of the gate structures 18, 20 could be accomplished by a gate first process, a high-k first approach from gate last process, or a high-k last approach from gate last process. Since this embodiment pertains to a high-k last approach, a gate dielectric layer 24 or interfacial layer, a gate material layer 26 made of polysilicon, and a selective hard mask (not shown) could be formed sequentially on the substrate 12, and a photo-etching process is then conducted by using a patterned resist (not shown) as mask to remove part of the gate material layer 26 through single or multiple etching processes. After stripping the patterned resist, gate structures 18, 20 each composed of a patterned material layer 26 are formed on the substrate 12.

Next, at least a spacer 28 is formed on the sidewalls of the each of the gate structures 18, 20 and source/drain regions 30 and/or epitaxial layers 32 are formed in the substrate 12 adjacent to two sides of the spacer 28. It should be noted that even though source/drain regions 30 are formed adjacent to two sides of the gate structures 18, 20 and in the substrate 12 between the gate structures 18, 20, only the source/drain regions 30 on left side of the gate structures 18 and the source/drain region 30 on right side of the gate structure 20 will be connected to external devices in the later process while the source/drain region 30 between the gate structures 18, 20 will not be connected to any external device. In other words, despite contact plugs will be formed on the source/drain regions 30 on left side of the gate structure 18, on right side of the gate structure 20, and between the two gate structures 18, 20 in the later process, only the source/drain regions 30 on left side of the gate structure 18 and on right side of the gate structure 20 will connect to external devices through the contact plugs as the contact plug formed on the source/drain region 30 between two gate structures 18, 20 will only be serving as dummy contact plug and not connected to any metal interconnection.

In this embodiment, the spacer 28 could be a single spacer or a composite spacer, such as a spacer including but not limited to for example an offset spacer and a main spacer. Preferably, the offset spacer and the main spacer could include same material or different material while both the offset spacer and the main spacer could be made of material including but not limited to for example $SiO_2$, SiN, SION, SiCN, or combination thereof. The source/drain regions 30 could include n-type dopants or p-type dopants depending on the type of device being fabricated.

In this embodiment, the epitaxial layers 32 could also be formed to include different materials depending on the type of transistor being fabricated. For instance, if the MOS transistor being fabricated were to be a PMOS transistor, the epitaxial layers 32 could be made of material including but not limited to for example SiGe, SiGeB, or SiGeSn. If the MOS transistor being fabricated were to be a NMOS transistor, the epitaxial layers 32 could be made of material including but not limited to for example SiC, SiCP, or SiP. Moreover, the SEG process could also be adjusted to form a single-layered epitaxial structure or multi-layered epitaxial structure, in which heteroatom such as germanium atom or carbon atom of the structure could be formed to have gradient while the surface of the epitaxial layers 32 are preferred to have less or no germanium atom at all to facilitate the formation of silicide afterwards.

According to an embodiment of the present invention, it would also be desirable to form source/drain regions 30 in part or all of the epitaxial layers 32. According to another embodiment of the present invention, the source/drain regions 30 could also be formed insituly during the SEG process. For instance, the source/drain regions 30 could be formed by implanting p-type dopants during formation of a SiGe epitaxial layer, a SiGeB epitaxial layer, or a SiGeSn epitaxial layer for PMOS transistor, or could be formed by implanting n-type dopants during formation of a SiC epitaxial layer, SiCP epitaxial layer, or SiP epitaxial layer for NMOS transistor. By doing so, it would be desirable to eliminate the need for conducting an extra ion implantation process for forming the source/drain regions 30. Moreover, the dopants within the source/drain regions 30 could also be formed with a gradient, which is also within the scope of the present invention.

Next, a contact etch stop layer (CESL) (not shown) could be formed on the gate structures 18, 20 and the STI 16, and an interlayer dielectric (ILD) layer 34 is formed on the gate structures 18, 20. Next, a planarizing process such as CMP is conducted to remove part of the ILD layer 34 and part of the CESL for exposing the gate material layer 26 made of polysilicon so that the top surface of the gate material layer 26 is even with the top surface of the ILD layer 34.

Referring to FIG. 2, FIG. 2 illustrates a method for fabricating the semiconductor device following FIG. 1, in which the top left portion of FIG. 2 illustrates a top view for fabricating the semiconductor device according to an embodiment of the present invention, the top right portion of FIG. 2 illustrates a circuit diagram of the semiconductor device, and the lower portion of FIG. 2 illustrates a cross-section view for fabricating the semiconductor device taken along the sectional line BB' of the top left portion of FIG. 2. As shown in FIG. 2, a replacement metal gate (RMG) process is conducted to transform the gate structures 18, 20 into metal gates. For instance, the RMG process could be accomplished by first performing a selective dry etching or wet etching process using etchants including but not limited to for example ammonium hydroxide ($NH_4OH$) or tetramethylammonium hydroxide (TMAH) to remove the gate material layers 26 from each of the gate structures 18, 20 for forming recesses (not shown) in the ILD layer 34.

Next, a selective interfacial layer (not shown) or gate dielectric layer 36, a high-k dielectric layer 46, a work function metal (WFM) layer 48, and a low resistance metal layer 50 are formed in the recesses, and a planarizing process such as CMP is conducted to remove part of low resistance metal layer 50, part of work function metal layer 48, and part of high-k dielectric layer 46 to form metal gates 52. In this embodiment, the gate structures or metal gates 52 fabricated through high-k last process of a gate last process preferably includes an interfacial layer or gate dielectric layer 36, a U-shaped high-k dielectric layer 46, a U-shaped work function metal layer 48, and a low resistance metal layer 50.

In this embodiment, the gate dielectric layer 24 and the gate dielectric layer 36 could be made of same or different materials such as silicon oxide. The high-k dielectric layer 46 is preferably selected from dielectric materials having dielectric constant (k value) larger than 4. For instance, the high-k dielectric layer 50 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 48 is formed for tuning the work function of the metal gate in accordance with the conductivity of the device. For an NMOS transistor, the work function metal layer 48 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 48 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 48 and the low resistance metal layer 50, in which the material of the barrier layer may include titanium (Ti), titanium nitride (TiN), tantalum (Ta) or tantalum nitride (TaN). Furthermore, the material of the low-resistance metal layer 50 may include copper (Cu), aluminum (Al), titanium aluminum (TiAl), cobalt tungsten phosphide (CoWP) or any combination thereof.

Next, part of the high-k dielectric layer 46, part of the work function metal layer 48, and part of the low resistance metal layer 50 are removed to form recesses (not shown), and a hard mask 54 is formed into the recesses so that the top surfaces of the hard mask 54 and the ILD layer 45 are coplanar, in which the hard mask 54 could be made of material including but not limited to for example $SiO_2$, SiN, SION, SiCN, or combination thereof. It should be noted that as a result of the selectivity between different materials during etching and removal of part of the high-k dielectric layer 46, part of the work function metal layer 48, and part of the low resistance metal layer 50, the top surface of the remaining low resistance metal layer 50 is slightly higher than the top surfaces of the high-k dielectric layer 46 and work function metal layer 48.

Specifically, as part of the high-k dielectric layer 46, part of the work function metal layer 48, and part of the low resistance metal layer 50 are removed by the etching process, selectivity between these layers 46, 48, 50 is adjusted to remove more high-k dielectric layer 46 and work function metal layer 48 and less low resistance metal layer 50 so that the top surface of the remaining work function metal layer 48 is lower than the top surface of the remaining high-k dielectric layer 46 and top surface of the remaining low resistance metal layer 50 while the top surface of the remaining high-k dielectric layer 46 is lower than the top surface of the remaining low resistance metal layer 50 and a recess 56 is formed between the ILD layer 34 and the metal gate 52. Preferably, the recess 56 is disposed in the work function metal layer 48 or if viewed from another perspective the recess 56 is formed by a sidewall of the high-k dielectric layer 46, a top surface of the work function metal layer 48, and a sidewall of the low resistance metal layer 50.

Referring to FIG. 3, FIG. 3 illustrates a method for fabricating the semiconductor device following FIG. 2, in which the top left portion of FIG. 3 illustrates a top view for fabricating the semiconductor device according to an embodiment of the present invention, the top right portion of FIG. 3 illustrates a circuit diagram of the semiconductor device, and the lower portion of FIG. 3 illustrates a cross-section view for fabricating the semiconductor device taken along the sectional line CC' of the top left portion of FIG. 3. As shown in FIG. 3, another ILD layer 58 is then formed on the ILD layer 34 and then a contact plug formation process is conducted to form contact plugs 60 connecting the source/drain regions 30 adjacent to the gate structures 18, 20. In this embodiment, the formation of the contact plugs 60 could be accomplished by first removing part of the ILD layers 34, 58 to form contact holes (not shown) and then depositing a barrier layer (not shown) and a metal layer (not shown) on the substrate 12 to fill the contact holes. Next, a planarizing process such as CMP is conducted to remove part of the metal layer, part of the barrier layer, and even part of the ILD layers 34, 58 to form contact plugs 60 in the contact holes as the top surface of the contact plugs 60 is even with the top surface of the ILD layer 58. In this embodiment, the ILD layers 34, 58 could include silicon oxide, the barrier layer is selected from the group consisting of Ti, Ta, TiN, TaN, and WN, and the metal layer is selected from the group consisting of Al, Ti, Ta, W, Nb, Mo, and Cu.

It should be noted that a salicide process could be conducted after the aforementioned barrier layer and metal layer are deposited in the contact holes. Preferably, the salicide process could be accomplished by conducting an anneal process after the barrier layer and metal layer are formed so that part of the barrier layer is reacted with the substrate to form silicides 62 between the substrate 12 and the contact plugs 60. Next, a back end of line (BEOL) process such as a metal interconnective process could be conducted by first forming an inter-metal dielectric (IMD) layer 64 on the ILD layer 58, performing a photo-etching process to remove part of the IMD layer 64 for forming contact holes (not shown) exposing the contact plug 60 adjacent to left side of the gate structure 18 and the contact plug 60 adjacent to right side of the gate structure 20, and then depositing metal or conductive material into the contact holes along with a planarizing process to form metal interconnections 70 made of via conductors 66 and trench conductors 68 on left side of the gate structure 18 and right side of the gate structure 20 but not directly on top of the contact plug 60 between the two gate structures 18, 20. It should further be noted that even though the metal interconnections 70 composed of via conductors 66 and trench conductors 68 are only connected to the contact plugs 60 adjacent to two sides of the gate structures 18, 20 as shown in the lower portion of FIG. 3, the metal interconnection 70 could in fact also connected to the ends of the gate structures 18, 20 through the contact plugs 60 directly on top of the gate structures 18, 20 as shown in the top view on top left portion of FIG. 3.

Since the contact plugs 60 between the gate structures 18, 20 are not connected to any external devices or elements through upper level metal interconnections, in contrast to the contact plugs 60 adjacent to left side of the gate structure 18 and right side of the gate structure 20 being active contact plugs, the contact plug 60 between the gate structures 18, 20 is a dummy contact plug 74. Next, a stop layer 72 is formed on the IMD layer 64. In this embodiment, the IMD layer 64 preferably includes silicon oxide or dielectric material having dielectric constant between 2.4-3.6 such as porous dielectric material including but not limited to for example silicon oxycarbide (SiOC) or carbon doped silicon oxide (SiOCH), the metal interconnections 70 preferably include copper, and the stop layer 72 preferably includes nitrogen doped carbide (NDC), silicon nitride, silicon carbon nitride (SiCN), or combination thereof. This completes the fabrication of a semiconductor device according to an embodiment of the present invention.

Referring to FIG. 3, FIG. 3 further illustrates a structural view of a semiconductor device according to an embodiment of the present invention. As shown in the lower portion of FIG. 3, the semiconductor device includes gate structures 18, 20 made of two metal gates 52 on the substrate 12, an ILD layer 34 surrounding the metal gates 52, recesses 56 disposed between the ILD layer 34 and the metal gates 52, contact plugs 60 disposed adjacent to two sides of the metal gates 52, and a dummy contact plug 74 disposed in the ILD layer 34 between the metal gates 52 and connected to the source/drain region 30, in which each of the metal gates 52 includes a high-k dielectric layer 46 disposed on the substrate 12, a work function metal layer 48 disposed on the high-k dielectric layer 46, and a low resistance metal layer 50 disposed on the work function metal layer 48. Preferably, each of the contact plugs 60 and the dummy contact plug 74 includes silicides 62 and the recesses 56 are disposed in the work function metal layer 48.

Viewing from a more detailed perspective, the top surface of the work function metal layer 48 is higher than both the top surface of the high-k dielectric layer 46 and the top surface of the low resistance metal layer 50 while the top surface of the high-k dielectric layer 46 is also lower than the top surface of the low resistance metal layer 50, and the recesses 56 are formed by a sidewall of the high-k dielectric layer 46 extending to the top surface of the work function metal layer 48 and a sidewall of the low resistance metal layer 50. For instance, the recess 56 on left side of the gate structure 18 includes a left sidewall or the sidewall of the high-k dielectric layer 46 being lower than the right sidewall or the sidewall of the low resistance metal layer 50, and the recess 56 on right side of the gate structure 56 includes a right sidewall of the sidewall of the high-k dielectric layer 46 being lower than the left sidewall or the sidewall of the low resistance metal layer 50. Moreover, the overall shape of each recess 56 could be adjusted depending on the condition of the actual fabrication process or the demand of product such that each recess 56 could include a V-shape or U-shape cross-section, which are all within the scope of the present invention.

As shown on the top left portion of FIG. 3, the semiconductor device if viewed from a top view perspective preferably includes gate structures 18 and 20 extending along a first direction such as Y-direction on the substrate 12, source/drain regions 30 extending a second direction such as X-direction adjacent to two sides of the gate structures 18, 20, a contact plug 60 extending along the Y-direction adjacent to one side such as left side of the gate structure 18 on the source/drain region 30, a contact plug 60 extending along the Y-direction adjacent to another side such as right side of the gate structure 20 on the source/drain region 30, and a dummy contact plug 74 extending along the Y-direction between the two gate structures 18, 20 on the source/ drain region 30. It should be noted that in contrast to the contact plugs 60 adjacent to left side of the gate structure 18 and right side of the gate structure 20 both having metal interconnections 70 made of via conductors 66 and trench conductors 68 disposed or directly contacted thereon for connecting to external circuits, no metal interconnections 70 are formed directly on top of the dummy gate structure 74 between the gate structures 18, 20 for connecting to external circuits.

Figure 4:
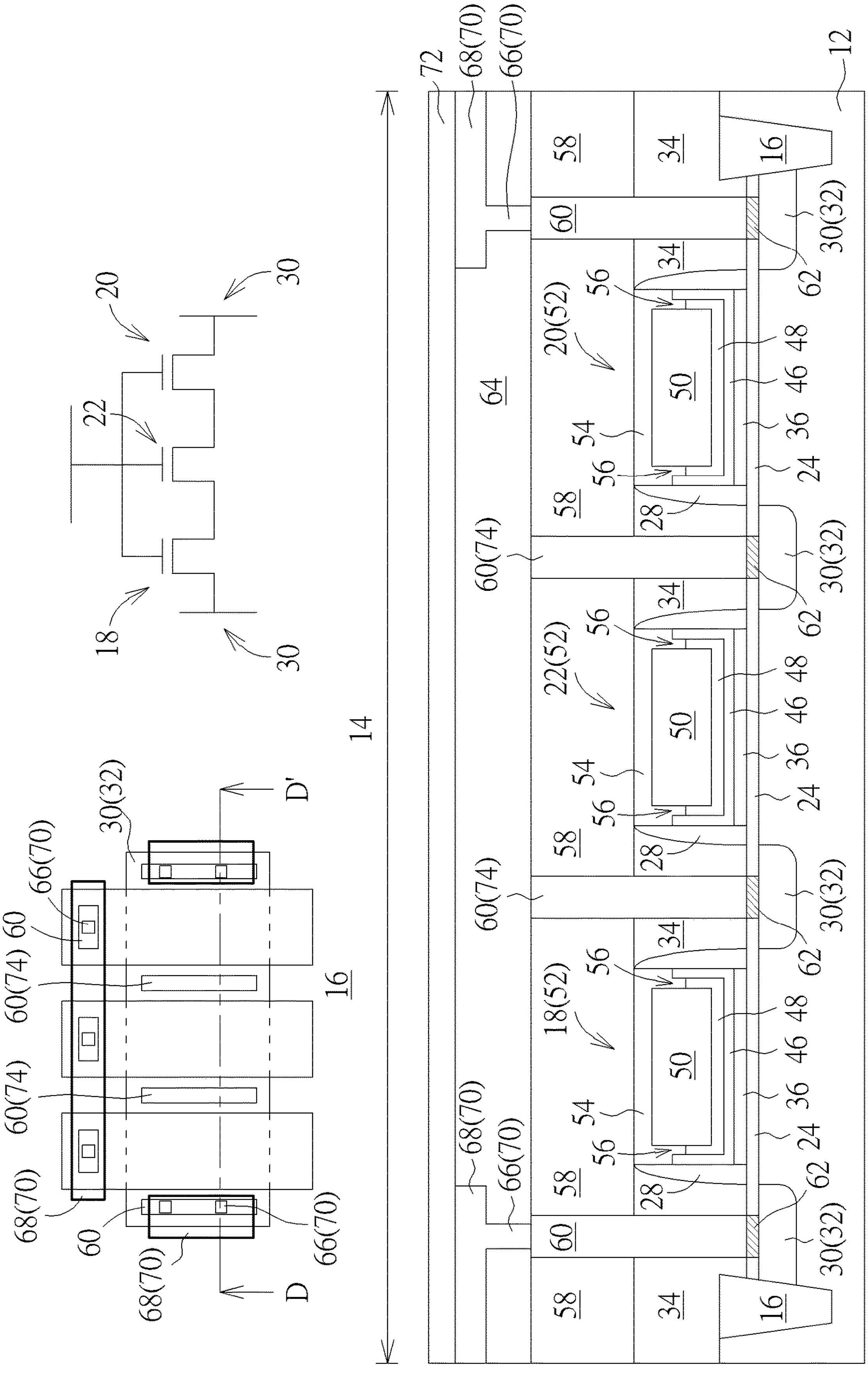
FIG. 4 illustrates a structural view of a semiconductor device according to an embodiment of the present invention.

Referring to FIG. 4, FIG. 4 illustrates a structural view of a semiconductor device according to an embodiment of the present invention, in which the top left portion of FIG. 4 illustrates a top view of the semiconductor device according to an embodiment of the present invention, the top right portion of FIG. 4 illustrates a circuit diagram of the semiconductor device, and the lower portion of FIG. 4 illustrates a cross-section view of the semiconductor device taken along the sectional line DD' of the top left portion of FIG. 4. As shown in FIG. 4, in contrast to the aforementioned embodiment of only disposing two gate structures 18, 20 on the transistor region 14 and connecting the two gate structures 18, 20 to a circuit in parallel according to the top right portion of FIG. 3, the present embodiment disposes three gate structures 18, 20, 22 in the transistor region 14 and connecting all three gate structures 18, 20, 22 to a circuit in parallel according to the top right portion of FIG. 4. Similar to the aforementioned embodiment, each of the gate structures 18, 20, 22 could be fabricated by transforming polysilicon gates into metal gates 52 according to RMG process as each of the gate structures 18, 20, 22 could include elements such as a high-k dielectric layer 46, a work function metal layer 48, and a low resistance metal layer 50. Moreover, contact plugs 60 are disposed adjacent to two sides of the gate structures 18, 20, 22, in which the contact plugs 60 adjacent to left side of the gate structure 18 and right side of the gate structure 20 include metal interconnections 70 made of via conductors 66 and trench conductors 68 thereon for connecting to external circuits. The contact plug 60 disposed between the gate structures 18, 22 and the contact plug 60 disposed between the gate structures 20, 22 on the other hand are dummy contact plugs 74. In other words, no metal interconnections 70 are formed directly on top or directly contacting the dummy contact plug 74 for further connecting to external circuits.

Figure 5:
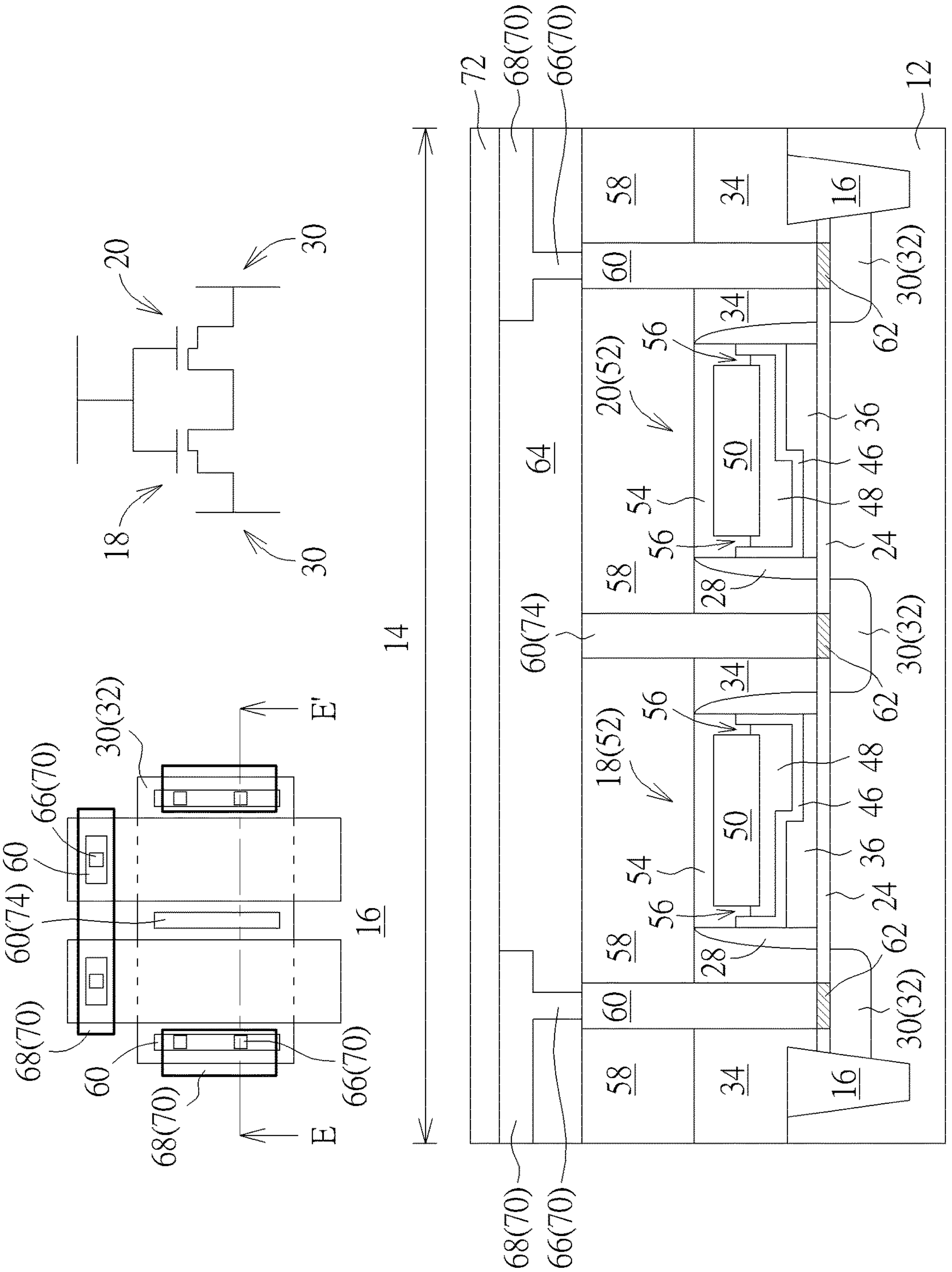
FIG. 5 illustrates a structural view of a semiconductor device according to an embodiment of the present invention.

Referring to FIG. 5, FIG. 5 illustrates a structural view of a semiconductor device according to an embodiment of the present invention, in which the top left portion of FIG. 5 illustrates a top view of the semiconductor device according to an embodiment of the present invention, the top right portion of FIG. 5 illustrates a circuit diagram of the semiconductor device, and the lower portion of FIG. 5 illustrates a cross-section view of the semiconductor device taken along the sectional line EE' of the top left portion of FIG. 5. As shown in the lower portion of FIG. 5, in contrast to the aforementioned gate dielectric layer 36 from dual gate structures having even or equal thickness as shown in FIG. 3, it would be desirable to conduct an extra etching process to remove part of the gate dielectric layers 36 after removing the gate material layers 26 made of polysilicon and forming gate dielectric layers 36 into the recesses during RMG process so that the left portion of gate dielectric layer 36 and the right portion of gate dielectric layer 36 would form different thicknesses. Next, high-k dielectric layer 46, work function metal layer 48, and low resistance metal layer 50 are formed on the gate dielectric layer 36 to form metal gates 52.

In this embodiment, the gate dielectric layer 36 from each of the gate structures 18, 20 preferably have uneven or different thicknesses, in which the gate dielectric layer 36 closer to the adjacent gate structures 18, 20 preferably have lower thickness. For instance, the thickness of the gate dielectric layer 36 closer to the right side in the left gate structure 18 is slightly lower than the thickness of the gate dielectric layer 36 closer to the left side, the thickness of the gate dielectric layer 36 closer to the left side in the right gate structure 20 is slightly lower than the thickness of the gate dielectric layer 36 closer to the right side, and a step profile is formed between the left portion of the gate dielectric layer 36 and right portion of the gate dielectric layer 36. Moreover, the particular lower portion or higher portion from each gate dielectric layer 36 could also have same or different thickness and/or lengths depending on the demand of the product. For instance, the width or length of the left portion of each gate dielectric layer 36 could be less than, greater than, or equal to the width or length of the right portion of each gate dielectric layer 36, which are all within the scope of the present invention.

Figure 6:
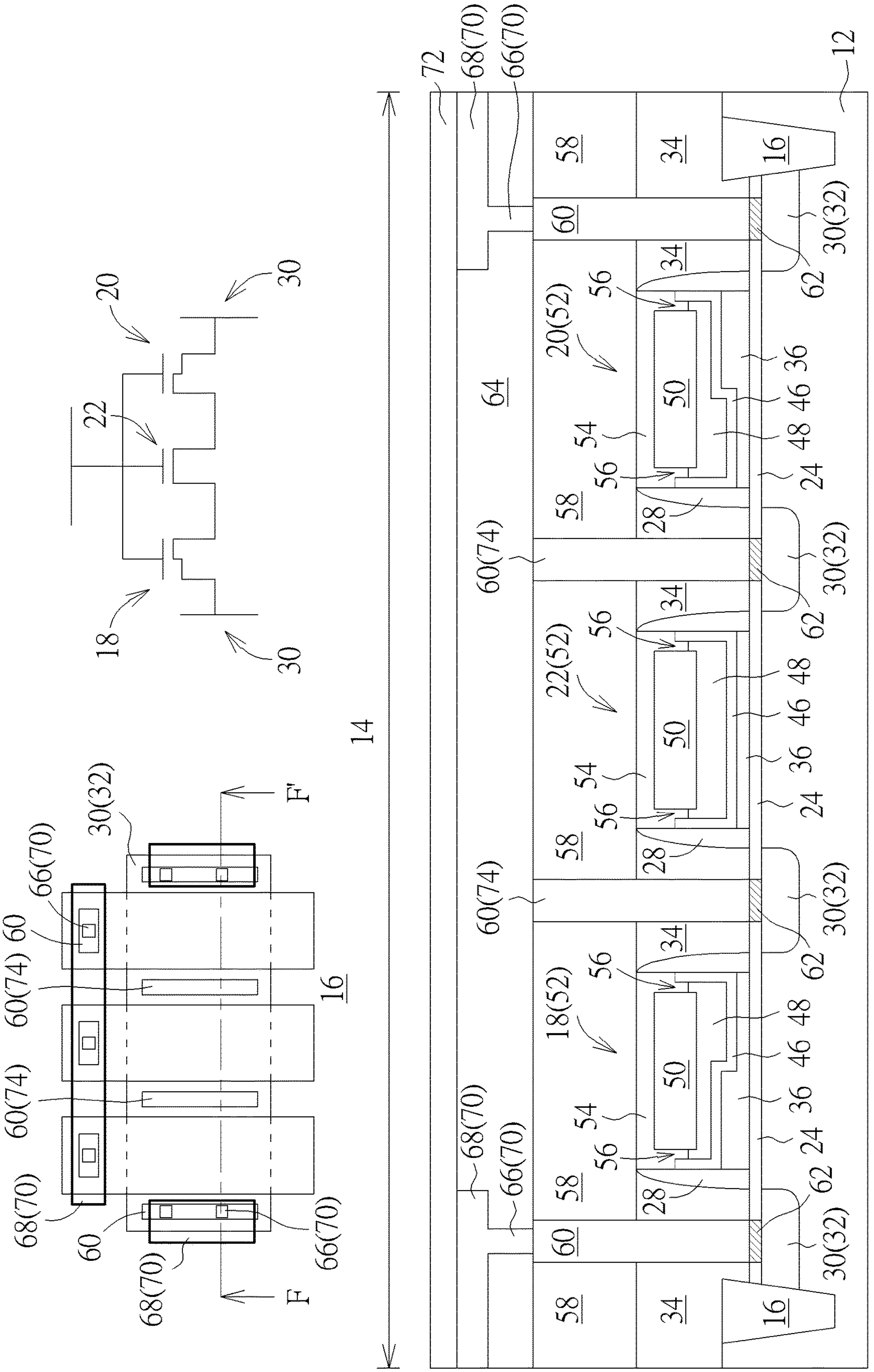
FIG. 6 illustrates a structural view of a semiconductor device according to an embodiment of the present invention.

Referring to FIG. 6, FIG. 6 illustrates a structural view of a semiconductor device according to an embodiment of the present invention, in which the top left portion of FIG. 6 illustrates a top view of the semiconductor device according to an embodiment of the present invention, the top right portion of FIG. 6 illustrates a circuit diagram of the semiconductor device, and the lower portion of FIG. 6 illustrates a cross-section view of the semiconductor device taken along the sectional line FF' of the top left portion of FIG. 6. As shown in the lower portion of FIG. 6, in contrast to the aforementioned gate dielectric layer 36 from three gate structures 18, 20, 22 having even or equal thickness as shown in FIG. 4, it would be desirable to conduct an extra etching process to remove part of the gate dielectric layers 36 in the left gate structure 18 and part of the gate dielectric layer 36 in the right gate structure 20 after removing the gate material layers 26 made of polysilicon and forming gate dielectric layers 36 into the recesses during RMG process so that the left portion of gate dielectric layer 36 and the right portion of gate dielectric layer 36 in the left gate structure 18 and right gate structure 20 would form different thicknesses while the entire gate dielectric layer 36 in the middle gate structure 22 kept an even thickness. Next, high-k dielectric layer 46, work function metal layer 48, and low resistance metal layer 50 are formed on the gate dielectric layer 36 to form metal gates 52.

In this embodiment, the gate dielectric layer 36 from each of the left gate structure 18 and right gate structure 20 preferably have uneven or different thicknesses while the gate dielectric layer 36 from the middle gate structure 22 has same or even thickness, in which the gate dielectric layer 36 closer to the adjacent gate structures 18, 20, 22 preferably have lower thickness. For instance, the thickness of the gate dielectric layer 36 closer to the right side in the left gate structure 18 is slightly lower than the thickness of the gate dielectric layer 36 closer to the left side, the thickness of the gate dielectric layer 36 closer to the left side in the right gate structure 20 is slightly lower than the thickness of the gate dielectric layer 36 closer to the right side, and a step profile is formed between the left portion of the gate dielectric layer 36 and right portion of the gate dielectric layer 36. Similar to the embodiment shown in FIG. 5, the particular lower portion or higher portion from each gate dielectric layer 36 could also have same or different thickness and/or lengths depending on the demand of the product. For instance, the width or length of the left portion of each gate dielectric layer 36 could be less than, greater than, or equal to the width or length of the right portion of each gate dielectric layer 36, which are all within the scope of the present invention.

Overall, in contrast to only disposing a single gate structure and a set of source/drain region adjacent to two sides of the gate structure in a single planar transistor region or active region in conventional DDIC fabrication process, the present invention forms two gate structures onto the space that was originally occupied by the single gate structure and forms active contact plugs adjacent to the most edge such as leftmost and rightmost gate structures and dummy contact plugs between the remaining gate structures. In other words, the overall length of a single gate structure from the conventional art would be substantially equal to the overall lengths of two or more gate structures from the present invention, in which the length of the gate structure could be defined as the distance of the gate structure extending along the X-direction in the aforementioned embodiments. Preferably, the gate structure from the aforementioned embodiments are applied to planar type transistors having greater pitch, hence the length of each of the gate structures is preferably greater than 0.25 microns or most preferably greater than 0.4 microns, 0.6 microns or 1 microns or larger, which are all within the scope of the present invention.

Moreover, it would also be desirable to conduct an extra etching process for adjusting partial thickness of the gate structure during RMG process as disclosed in FIGS. 5-6 of the present invention so that the gate dielectric layer 36 would form uneven thicknesses, in particular the side of the gate dielectric layer 36 closer to adjacent gate structure would have lower thickness while another side of the gate dielectric layer 36 away from adjacent gate structure would have greater thickness. By connecting multiple gate structure in parallel for forming stack gate structures and/or creating gate dielectric layers having uneven thickness, undercut issue caused by over-etching of work function metal layers during RMG process could be improved substantially.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:

a metal gate on a substrate, the metal gate comprising a gate dielectric layer, a high-k dielectric layer on the gate dielectric layer, and a work function metal (WFM) layer on the high-k dielectric layer;

an interlayer dielectric (ILD) layer around the metal gate; and a recess between the ILD layer and the metal gate, wherein the gate dielectric layer comprises a first thickness at a first end of the metal gate and a second thickness at a second end of the metal gate, the first thickness is less than the second thickness to form a step profile, the high-k dielectric layer is conformal to the step profile, the WFM layer comprises a third thickness at the first end of the metal gate and a fourth thickness at the second end of the metal gate, the third thickness is greater than the fourth thickness.

2. The semiconductor device of claim 1, wherein the metal gate further comprises a low resistance metal layer on the WFM layer.

3. The semiconductor device of claim 2, wherein a top surface of the WFM layer is lower than a top surface of the high-k dielectric layer.

4. The semiconductor device of claim 2, wherein a top surface of the WFM layer is lower than a top surface of the low resistance metal layer.

5. The semiconductor device of claim 2, wherein the recess is in the WFM layer.

6. The semiconductor device of claim 2, wherein the recess comprises a U-shape.

7. The semiconductor device of claim 1, wherein a length of the metal gate is greater than 0.25 microns.

8. A semiconductor device, comprising:

a first gate structure and a second gate structure extending along a first direction on a substrate;

a first contact plug extending along the first direction adjacent to one side of the first gate structure;

a second contact plug extending along the first direction adjacent to another side of the second gate structure; and a dummy contact plug extending along the first direction between the first gate structure and the second gate structure, wherein at least one of the first gate structure and the second gate structure comprises a metal gate, the metal gate comprising a gate dielectric layer, a high-k dielectric layer on the gate dielectric layer, and a work function metal (WFM) layer on the high-k dielectric layer, the gate dielectric layer comprises a first thickness at a first end of the metal gate and a second thickness at a second end of the metal gate, the first thickness is less than the second thickness to form a step profile, the high-k dielectric layer is conformal to the step profile, the WFM layer comprises a third thickness at the first end of the metal gate and a fourth thickness at the second end of the metal gate, the third thickness is greater than the fourth thickness.

9. The semiconductor device of claim 8, further comprising:

a source/drain region extending along a second direction adjacent to two sides of the first gate structure and the second gate structure.

10. The semiconductor device of claim 9, wherein the first contact plug is on the source/drain region.

11. The semiconductor device of claim 9, wherein the second contact plug is on the source/drain region.

12. The semiconductor device of claim 8, further comprising a metal interconnection connecting the first contact plug.

13. The semiconductor device of claim 8, further comprising a metal interconnection connecting the second contact plug.

14. The semiconductor device of claim 8, wherein the first contact plug comprises a silicide.

15. The semiconductor device of claim 8, wherein the second contact plug comprises a silicide.

16. The semiconductor device of claim 8, wherein the dummy contact plug comprises a silicide.

* * * * *